United States Patent
Yamagata (10) Patent No.: US 7,510,910 B2
(45) Date of Patent: Mar. 31, 2009

(54) SEMICONDUCTOR DEVICE AND PRODUCTION METHOD THEREOF

(75) Inventor: Osamu Yamagata, Kanagawa (JP)

(73) Assignee: Sony Corporation (JP)

(*) Notice: Subject to any disclaimer, the term of this patent is extended or adjusted under 35 U.S.C. 154(b) by 378 days.

(21) Appl. No.: 11/588,315

(22) Filed: Oct. 27, 2006

(65) Prior Publication Data

US 2007/0042561 A1    Feb. 22, 2007

Related U.S. Application Data

(62) Division of application No. 10/930,797, filed on Sep. 1, 2004, now Pat. No. 7,170,175.

(30) Foreign Application Priority Data

Sep. 26, 2003 (JP) ............................ P2003-335703

(51) Int. Cl.
*H01L 21/44* (2006.01)
*H01L 21/48* (2006.01)

(52) U.S. Cl. ............... 438/118; 438/127; 438/460; 438/613; 438/622

(58) Field of Classification Search ............. None
See application file for complete search history.

(56) References Cited

U.S. PATENT DOCUMENTS 5,795,815 A * 8/1998 Vokoun et al. ............ 438/462

FOREIGN PATENT DOCUMENTS

| JP | 61-251052 | 11/1986 |
|---|---|---|
| JP | 02-188942 | 7/1990 |
| JP | 10-074891 | 3/1998 |
| JP | 2001-127010 | 5/2001 |
| JP | 2001-308100 | 11/2001 |
| JP | 2003-526945 | 9/2003 |

OTHER PUBLICATIONS

Japanese Office Action dated Apr. 30, 2008 for corresponding Japanese Application No. 2003-335703.

* cited by examiner

*Primary Examiner*—N Drew Richards
*Assistant Examiner*—Khanh B Duong
(74) *Attorney, Agent, or Firm*—Rader Fishman & Grauer PLLC; Ronald P. Kananen (57) ABSTRACT

A semiconductor device and a production method thereof capable of reducing warps of a semiconductor wafer when packaging at a wafer level in a SiP-type semiconductor device, which is configured so that an insulating layer is formed by stacking a plurality of resin layers on a semiconductor chip formed with an electronic circuit, wiring layers are buried in the insulating layer and electrically connected to electrodes, and formation areas of the plurality of resin layers become gradually smaller from an area of an upper surface of the semiconductor chip as they get farther from the semiconductor chip, so that a side surface and an upper surface of each of the resin layers and the upper surface of the semiconductor chip form a stepwise shape.

5 Claims, 6 Drawing Sheets

FIG. 1

| 10a | ... | SEMICONDUCTOR CHIP |
|---|---|---|
| 20 | ... | FIRST RESIN LAYER |
| 21 | ... | SECOND RESIN LAYER |
| 22 | ... | THIRD RESIN LAYER |
| 23 | ... | FOURTH RESIN LAYER |
| 30, 31 | ... | FIRST WIRING LAYER |
| 32, 33 | ... | SECOND WIRING LAYER |
| 34, 35 | ... | THIRD WIRING LAYER |

SEMICONDUCTOR DEVICE AND PRODUCTION METHOD THEREOF

The present application is a divisional application of the patent application Ser. No. 10/930,797, filed Sep. 1, 2004 now U.S. Pat. No. 7,170,175, the entire contents of which are incorporated herein by reference.

BACKGROUND OF THE INVENTION

1. Field of the Invention

The present invention relates to a semiconductor device a the production method therefor, and, particularly to a semiconductor device of a type called a system-in-package (SiP), which is packaged at a wafer level, and a production method therefor.

2. Description of the Related Art

Demands for more compact, thinner and lighter portable electronic devices, such as digital video cameras, digital cellular phones, and notebook computers, only get stronger. To respond thereto, seven tenths of a reduction has been realized in three years in a recent VLSI and other semiconductor devices, while studies and developments have been made on the significant issue of how to improve packaging density of components on a mounting board (printed wiring board) in an electronic circuit device wherein such a semiconductor device is mounted on a printed wiring board.

For example, the package type of a semiconductor device has shifted from the lead-inserted type, such as a dual inline package (DIP), to the surface-mounted type. Furthermore, a flip-chip mounting method for providing a bump (protruding electrode) made of solder or gold on a pad electrode of a semiconductor chip and connecting to the wiring board via the bump with the surface facing downward has been developed.

In the above semiconductor device, when forming multilayer wiring, also called rewiring layers, on the semiconductor substrate (chip), for example, an insulating layer is formed to be a film thickness of 1 µm or less on a surface of a semiconductor wafer formed with a transistor and other semiconductor elements by the chemical vapor deposition (CVD) method, the sputtering method, the thermal oxidization method or the spin coating method, etc., and dicing processing is performed to obtain a small piece of semiconductor device.

In the above production method, even when a step is generated on the insulating layer and warps arise on the wafer, it is sufficient to pay attention only to the blade and chipping at the dicing stage and it is unnecessary to pay attention to the step disconnection of a resist and warps of the wafer.

Furthermore, development has been advanced to a complicated type of package called a system-in-package (SiP) wherein a passive element, such as a coil, and other semiconductor chips are buried in an interlayer of an insulating layer for insulating rewiring layers formed on a semiconductor substrate (chip) and packaged at a wafer level.

As a production method of the SiP, for example, a method of forming as the insulating layer of the rewiring layers an insulating layer made of a polyimide resin and an epoxy resin, etc., to be a film thickness of 10 µm or less by the spin coating method on the surface of the semiconductor wafer formed with a transistor and other semiconductor element and performing dicing processing to obtain a small piece has been widely used.

Here, in the case where property values of the insulating layer are different in an elastic modulus and a thermal expansion coefficient from those in the semiconductor made by silicon, etc., a method of removing a resin on a scribe line in advance and cutting on the exposed scribe line to obtain a small piece is used.

In the production method of the SiP as above, in the case where the insulating layer of the rewiring layers is made to be a multilayer of, for example, three layers or more, when assuming that a film thickness of one layer is 10 µm at minimum, the thickness becomes 30 µm by putting the three layers together, so that it becomes relatively impossible to ignore the film thickness of the insulating layer of the rewiring layer in the case where, for example, a silicon substrate is made to be as thin as 50 µm or less.

Furthermore, in the case of forming a coil and other passive elements in an interlayer of the insulation layer of the rewiring layers in the SiP structure and in the case of burying a semiconductor chip, the film thickness of the whole insulating layer of the rewiring layers has to be 50 µm or more, and an effect given to warps of the semiconductor wafer becomes large.

When warps arise on the semiconductor wafer, an adsorbent error and a conveyance error may be caused in a production facility and breakage and a decline of the yield may also be brought. Furthermore, a disadvantage of a decline of secondary connection reliability is unfavorably caused due to residual stress.

SUMMARY OF THE INVENTION

An object of the present invention is to prevent the arising of warps of a semiconductor wafer when an insulating layer in rewiring layers becomes thick in a SiP type semiconductor device, which may cause an adsorption error and a conveyance error in a production facility, breakage, a decline of the yield and a decline of secondary connection reliability due to residual stress.

According to the present invention, there is provided a semiconductor device comprising a semiconductor chip with a built-in electronic circuit, having electrodes formed on a surface thereof which are taken out from the electronic circuit, an insulating layer formed of a plurality of resin layers stacked on the semiconductor chip, and a wiring layer formed to be electrically connected to the electrodes and buried in the insulating layer, wherein the plurality of resin layers is formed so that as the layers get farther from the semiconductor chip, their formation areas become gradually smaller from an area of an upper surface of the semiconductor chip, and a side surface and an upper surface of each of the resin layers and the upper surface of the semiconductor chip form a stepwise shape.

In the semiconductor device of the present invention, an insulating layer is configured by stacking a plurality of resin layers on a semiconductor chip formed with an electronic circuit, wherein a wiring layer is buried to be electrically connected to electrodes.

Here, the plurality of resin layers has the configuration wherein the layers' formation areas become gradually smaller from an area of an upper surface of the semiconductor chip as they get farther from the semiconductor chip, and a side surface and an upper surface of each of the resin layers and the upper surface of the semiconductor chip form a stepwise shape.

Also, according to the present invention, there is provided a production method of a semiconductor device, including the steps of forming integrated electronic circuits corresponding to a plurality of semiconductor chips on a semiconductor wafer, and forming electrodes on a surface of the semiconductor wafer by taking them out from the electronic circuits, forming a pattern of a first resin layer on the surface of the semiconductor wafer except for a scribe line to be a dicing region, forming on the first resin layer a pattern of a first wiring layer electrically connected to the electrodes, forming a pattern of a second resin layer to cover the first resin layer and the first wiring layer except for the scribe line, and dicing the semiconductor wafer on the scribe line, wherein in the step of forming the second resin layer, the second resin layer is formed on a smaller area than that of the first resin layer, so that a side surface and an upper surface of each of the first resin layer and the second resin layer form a stepwise shape.

In the production method of the semiconductor device of the present invention, electronic circuits corresponding to a plurality of semiconductor chips are formed to be integrated on the semiconductor wafer first, and electrodes are formed on its surface by being taken out from the electronic circuits.

Next, a pattern of a first resin layer is formed on a surface of the semiconductor wafer except for a scribe line to be a dicing region, a pattern of a first wiring layer is formed on the first resin layer and electrically connected to the electrodes, and a pattern of a second resin layer is formed to cover the first resin layer and the first wiring layer except for the scribe line.

Next, dicing for cutting the semiconductor wafer on the scribe line is performed.

When forming the second resin layer, it is formed to have a smaller area than that of the first resin layer, so that a side surface and an upper surface of each of the first resin layer and the second resin layer form a stepwise shape.

BRIEF DESCRIPTION OF DRAWINGS

These and other objects and features of the present invention will become clearer from the following description of the preferred embodiments given with reference to the attached drawings, in which.

DESCRIPTION OF THE PREFERRED EMBODIMENT

Below, an embodiment of the present invention will be explained with reference to the drawings.

Figure 1:
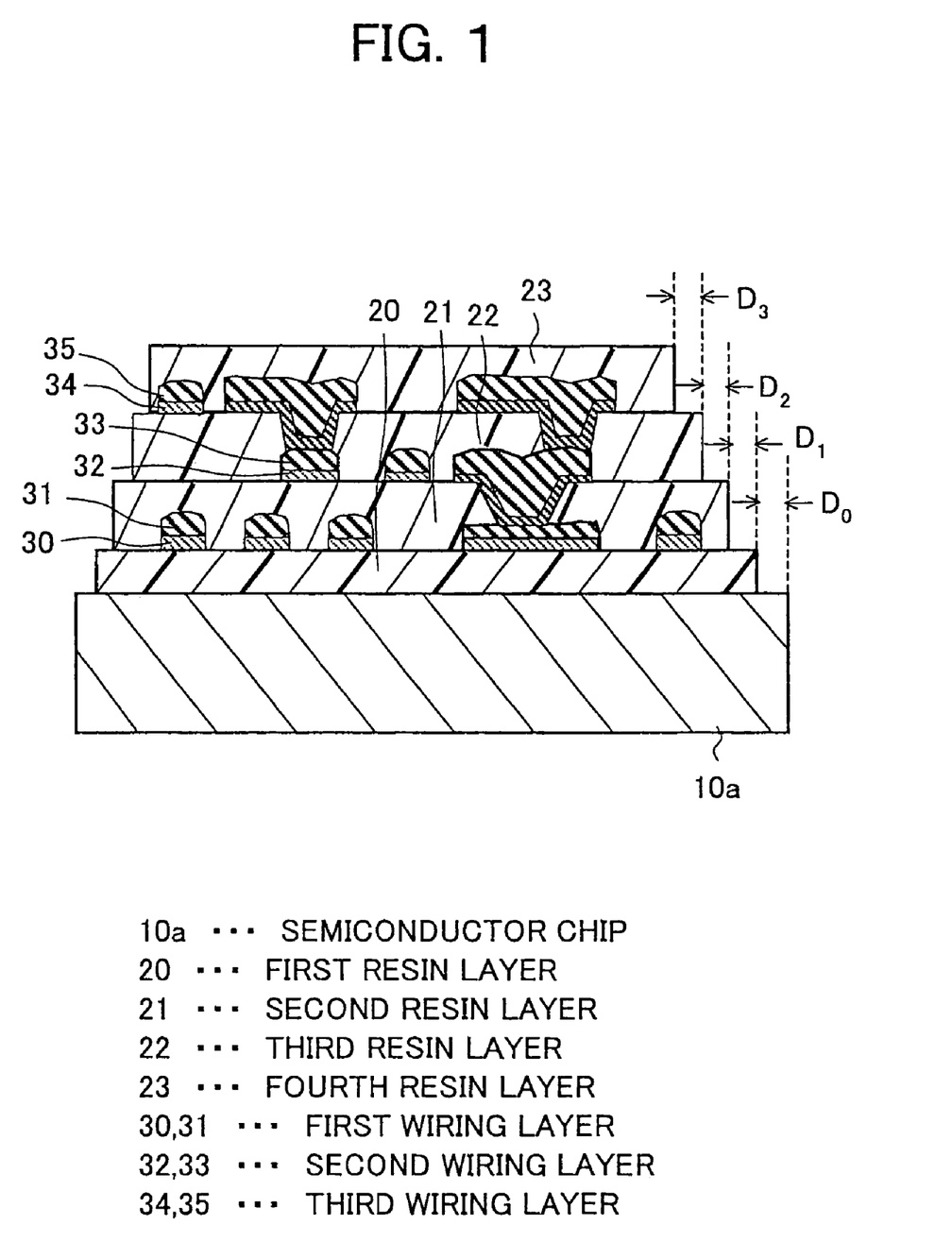
FIG. 1 is a sectional view of a semiconductor device according to an embodiment of the present invention.

FIG. 1 is a schematic sectional view of a semiconductor device according to the present embodiment.

On the surface of a semiconductor chip (semiconductor substrate) 10a formed with an electronic circuit including a transistor and other semiconductor elements, electrodes (not shown) taken out from the electronic circuit are formed. On the semiconductor substrate (chip) 10a, an insulating layer configured by stacking a first resin layer 20, a second resin layer 21, a third resin layer 22 and a fourth resin layer 23 is formed.

Wiring layers composed of first wiring layers (30, 31), second wiring layers (32, 33) and third wiring layers (34, 35) are formed by being buried in the insulating layer composed of the above stacked resin layers. The wiring layers are formed to be electrically connected to the electrodes taken out from the electronic circuit of the semiconductor chip 10a in a not shown part.

In the above configuration, formation areas of the first resin layer 20, the second resin layer 21, the third resin layer 22 and the fourth resin layer 23 become gradually smaller from an area of an upper surface of the semiconductor chip 10a as they get farther from the semiconductor chip 10a, so that a side surface and an upper surface of each of the first resin layer 20, the second resin layer 21, the third resin layer 22 and the fourth resin layer 23 and an upper surface of the semiconductor chip 10a form a stepwise shape.

Each of the widths ($D_1$, $D_2$ and $D_3$) of exposed upper surfaces of the respective resin layers (20, 21 and 22) on the stepwise formed portion is preferably 5 µm or more, and is, for example, 5 µm. Note that a width $D_0$ of an exposed part of the semiconductor chip 10a being out of the first resin layer 20 depends on the width of the scribe line on the semiconductor wafer before dicing, and is, for example, 10 µm or so. When the above widths ($D_1$, $D_2$ and $D_3$) are 5 µm or more, coverage of a resist film covering over the scribe line becomes preferable in the production method.

It is also possible to form the electronic element and/or the semiconductor chip by burying them in the insulating layer so as to be electrically connected to the respective wiring layers.

According to the semiconductor device of the above present embodiment, in a SiP-type semiconductor device wherein an insulating layer is configured by stacking a plurality of resin layers on a semiconductor chip, it is configured so that formation areas of the plurality of resin layers become gradually smaller from an area of an upper surface of the semiconductor chip as they get farther from the semiconductor chip, and a side surface and an upper surface of each of the resin layers and the upper surface of the semiconductor chip form a stepwise shape, and consequently, a stress imposed on the semiconductor wafer is small even in a stage before dicing and warps are suppressed.

Next, a production method of the above semiconductor device will be explained with reference to the drawings.

Figure 2A:
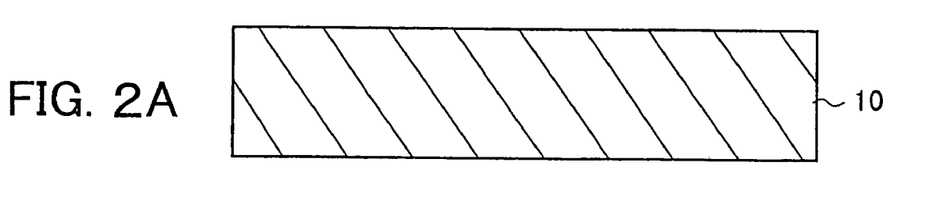
FIG. 2A to FIG. 2C are views of production steps of the semiconductor device according to the embodiment of the present invention.

First, as shown in FIG. 2A, electronic circuits (not shown) including a transistor and other semiconductor elements and corresponding to a plurality of semiconductor chips are formed to be integrated on the semiconductor wafer 10. Furthermore, electrodes (not shown) are formed on the surface of the semiconductor wafer 10 so as to be taken out from the electronic circuits.

Figure 2B:
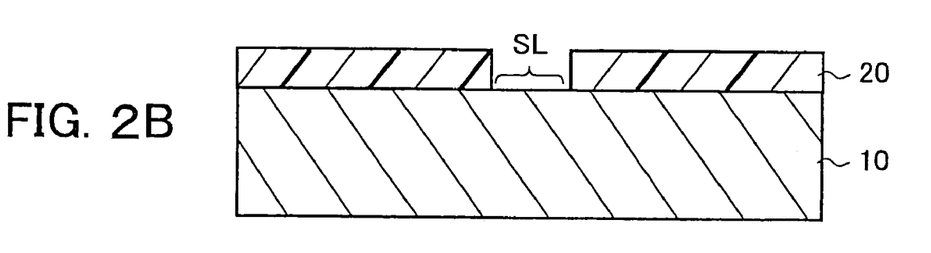

Next, as shown in FIG. 2B, except for a scribe line SL to be a dicing region, a pattern of the first resin layer 20 is formed, for example, to be a film thickness of 10 µm or so on the semiconductor wafer 10.

The first resin layer is formed by using a negative photosensitive resin material, such as a polyimide resin, an epoxy resin and an acrylic resin, by the spin coating method, the printing method or the CVD method, etc., and subjected to exposure by using a photomask, so that regions other than the scribe line are irradiated. When using, for example, a photosensitive polyimide resin, the exposure is performed by broadband exposure to covering lights of a g-line, an h-line and an i-line with energy of 300 mJ/cm$^2$. In the case of an epoxy resin, exposure is performed with energy of 2000 mJ/cm$^2$.

Furthermore, development processing is performed by using a 2.38% trimethylammonium hydroxide solution as a developing solution. Due to photosensitivity of the used resin, the scribe line SL opens in the development stage. Here, in the case of a negative photosensitive resin, as a result that curing proceeds by photoreaction, a pattern shape varies by the exposure condition and the actual condition, but it becomes a tapered opening shape.

The scribe line SL is formed to be a width of, for example, 78 μm.

Figure 2C:
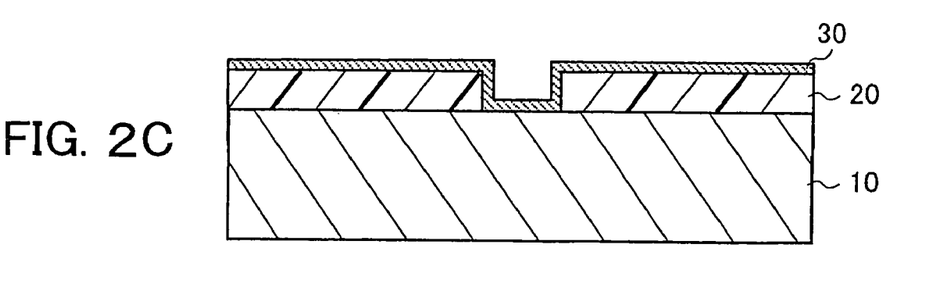

Next, as shown in FIG. 2C, a seed layer 30 is formed all over, for example, by the sputtering method. As a seed layer for plating copper, for example, a film of Ti/Cu is formed to be a film thickness of 160 nm/600 nm.

Figure 3A:
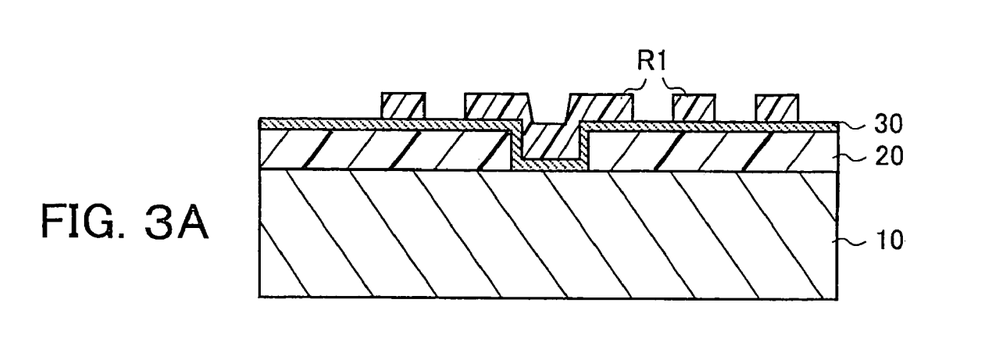
FIG. 3A to FIG. 3C are sectional views of production steps of the semiconductor device according to the embodiment of the present invention.

Next, as shown in FIG. 3A, a negative or positive resist film is formed on the seed layer 30, for example, by the spin coating; pattern exposure is performed by using a photomask, so that the pattern remains on regions other than formation regions of the first wiring layer in a predetermined wiring circuit pattern; and development processing is performed to form a pattern of the first resist film R1. The regions not formed with the first resist film R1 become formation regions of the first wiring layer. Since the first wiring layer is not formed on the scribe line SL, it is covered with the first resist film R1.

Figure 3B:
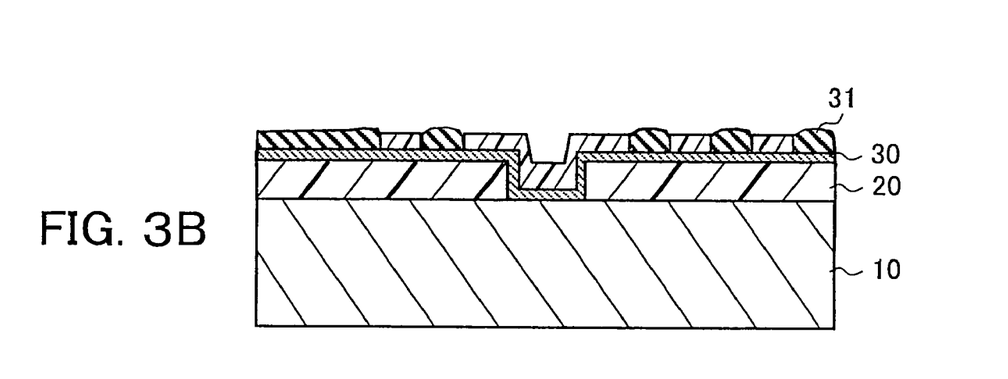

Next, as shown in FIG. 3B, a copper film is formed on regions other than the formation regions of the first resist film R1 by performing electroforming plating processing using the seed layer 30 as one electrode, and a copper plating layer 31 is formed in a predetermined wiring circuit pattern.

Figure 3C:
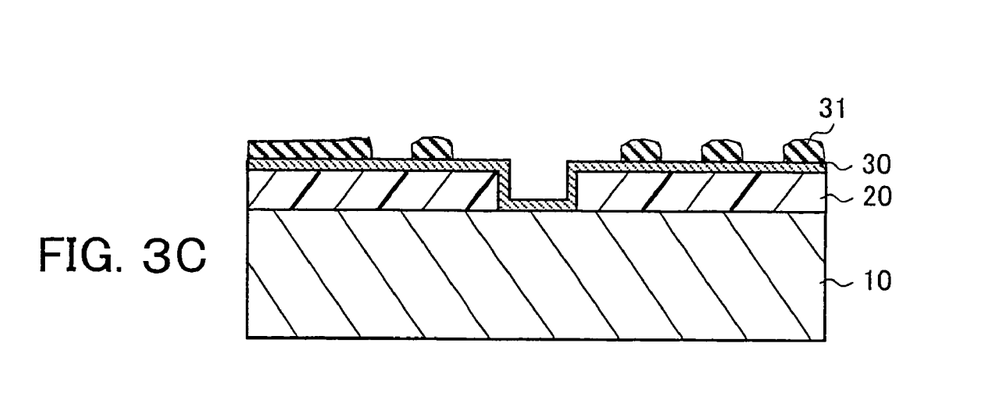
Figure 4A:
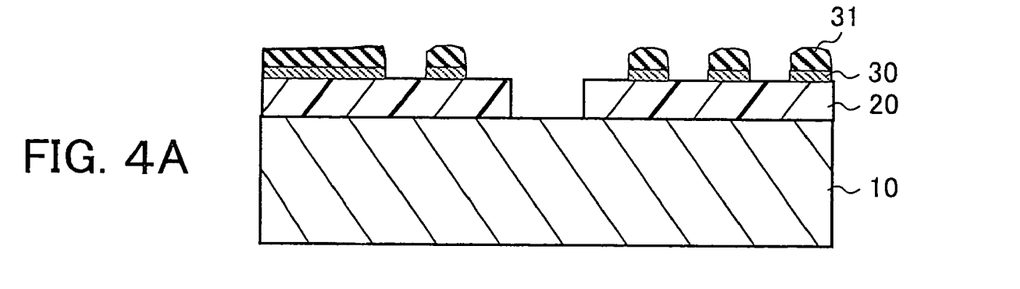
FIG. 4A to FIG. 4C are sectional views of production steps of the semiconductor device according to the embodiment of the present invention.

Next, as shown in FIG. 3C, the first resist film R1 is peeled by solvent processing, etc. to make the copper plating layer 31 exposed. Wet etching, etc., is performed by using the copper plating layer 31 as shown in FIG. 4A, and the seed layer 30 between the copper plating layers 31 is removed in order to insulate. As a result, the first wiring layer composed of the seed layer 30 and the copper plating layer 31 is formed. While the first wiring layer is not shown in FIG. 4A, it is formed so as to be connected to electrodes (not shown) provided on the surface of the semiconductor wafer 10.

Figure 4B:
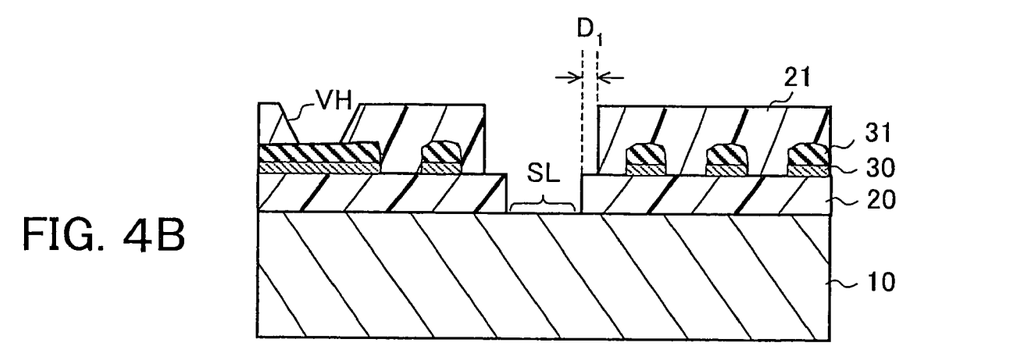

Next, as shown in FIG. 4B, except for the scribe line SL to be a dicing region and a via hole VH, a pattern of the second resin layer 21 is formed to be a film thickness of, for example, 10 μm or so on the first wiring layer (30, 31).

The second resin layer 21 can be formed by the same means and material as those of the first resin layer 20. In the step of forming the second resin layer 21, the layer is formed to have a smaller area than that of the first resin layer 20, so that a side surface and an upper surface of the first resin layer 20 and the second resin layer 21 form a stepwise shape.

On the stepwise formed portion, a width $D_1$ of the exposed upper surface of the first resin layer 20 that is out of the second resin layer 21 is preferably 5 μm or more and is assumed to be, for example, 5 μm.

The via hole VH connected to the first wiring layer (30, 31) can be formed in the same way.

Figure 4C:
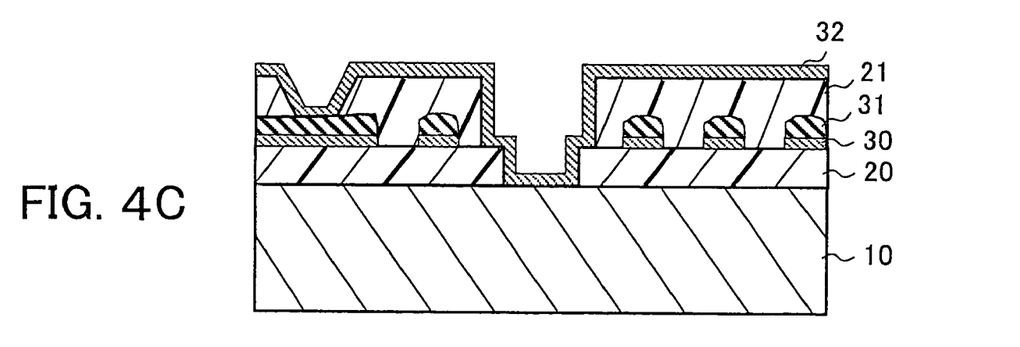

Next, as shown in FIG. 4C, a seed layer 32 is formed all over, for example, by the sputtering method in the same way as the above.

Since the width $D_1$ of the exposed upper surface of the first resin layer 20 that is out of the second resin layer 21 is 5 μm or more, coverage of the seed layer 32 covering the scribe line becomes preferable and step disconnection on the seed layer 32 can be prevented.

Figure 5A:
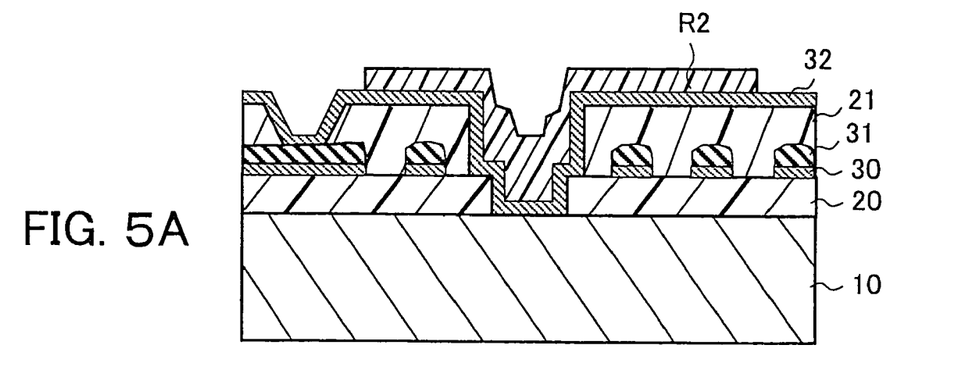
FIG. 5A to FIG. 5C are sectional views of production steps of the semiconductor device according to the embodiment of the present invention.

Next, as shown in FIG. 5A, a resist film is formed on the seed layer 32, for example, by spin coating and a pattern of a second resist film R2 for protecting the scribe line SL and regions other than formation regions of the second wiring layer is formed.

Since the width $D_1$ of the exposed upper surface of the first resin layer 20 that is out of the second resin layer 21 is 5 μm or more, coverage of the resist film R2 covering the scribe line becomes preferable and step disconnection on the resist film R2 can be prevented.

Figure 5B:
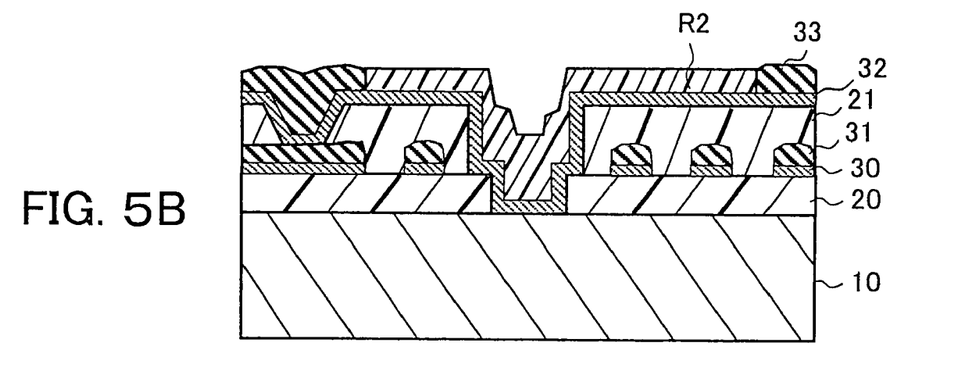

Next, as shown in FIG. 5B, electroforming plating processing is performed by using the seed layer 32 as one electrode to form a copper film on regions other than the formation regions of the second resist film R2, and a copper plating layer 33 is formed in a predetermined wiring circuit pattern.

Figure 5C:
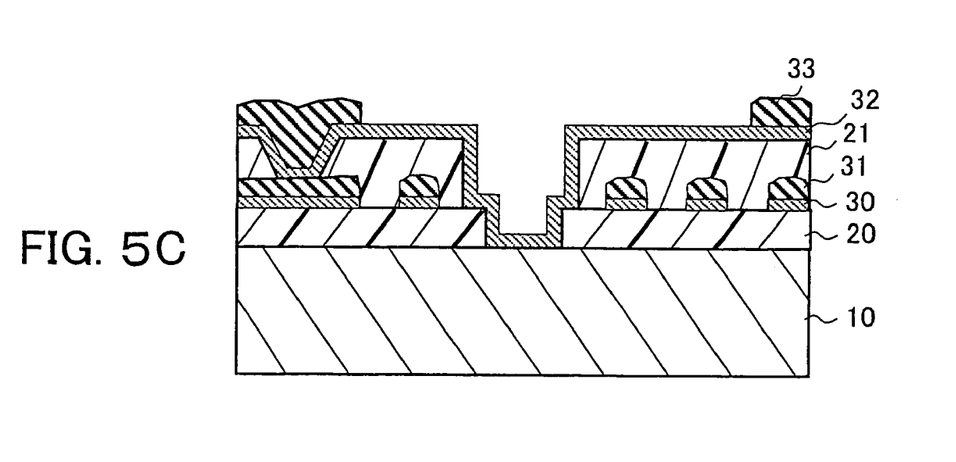
Figure 6A:
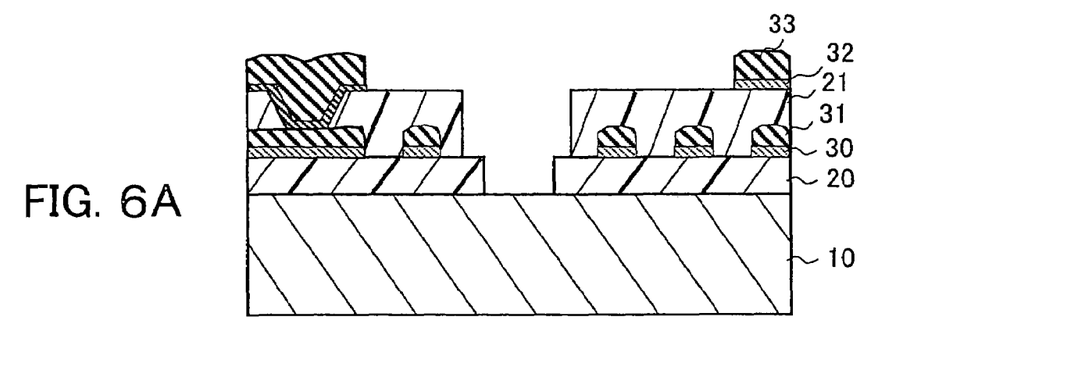
FIG. 6A to FIG. 6C are sectional views of production steps of the semiconductor device according to the embodiment of the present invention.

Next, as shown in FIG. 5C, the second resist film R2 is peeled, and the seed layer 32 between the respective copper plating layer 33 is removed by etching, as shown in FIG. 6A, to form a second wiring layer composed of the seed layer 32 and the copper plating layer 33. The second wiring layer is formed to be electrically connected to the first wiring layer via the via hole VH.

Figure 6B:
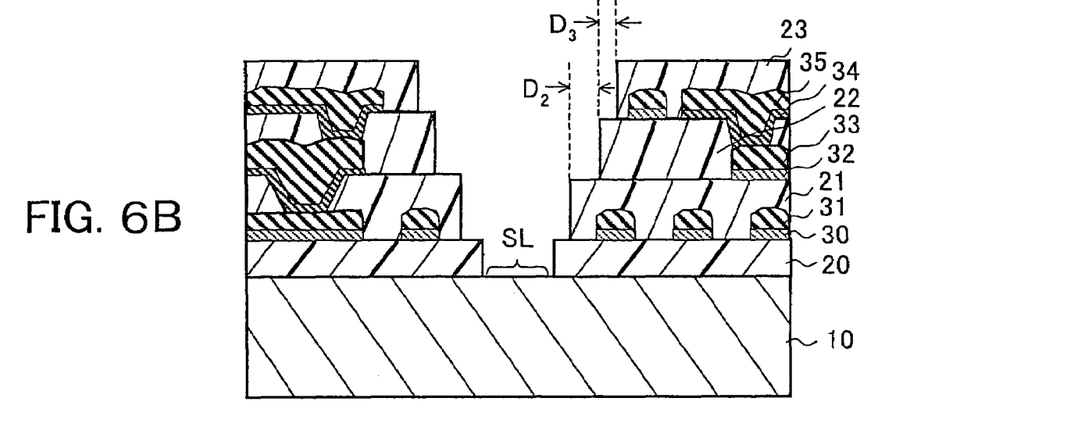

Next, as shown in FIG. 6B, by repeating the same steps as above, the third resin layer 22 and the fourth resin layer 23 are formed in the same way as the first resin layer 20 and the second resin layer 21, and the third wiring layer (34, 35) is formed in the same way as the first wiring layer (30, 31) and the second wiring layer (32, 33), respectively. The third wiring layer (34, 35) is formed to be connected to the second wiring layer (32, 33) in the via hole.

Here, in a step of forming the third resin layer 22, the layer is formed to have a smaller area than that of the second resin layer 21, so that a side surface and an upper surface of each of the second resin layer 21 and the third resin layer 22 form a stepwise shape. Also, in a step of forming the fourth resin layer 23, the layer is formed to have a smaller area than that of the third resin layer 22, and a width ($D_2$, $D_3$) of an exposed upper surface of a lower resin layer that is out of its upper resin layer is 5 μm or more, for example 5 μm, so that a side surface and an upper surface of each of the third resin layer 22 and the fourth resin layer 23 form a stepwise shape.

In the above steps, the first to fourth resin layers (20, 21, 22 and 23) are not formed on the scribe line SL on the semiconductor wafer 10, and the upper surface of the semiconductor wafer 10 is exposed.

Figure 6C:
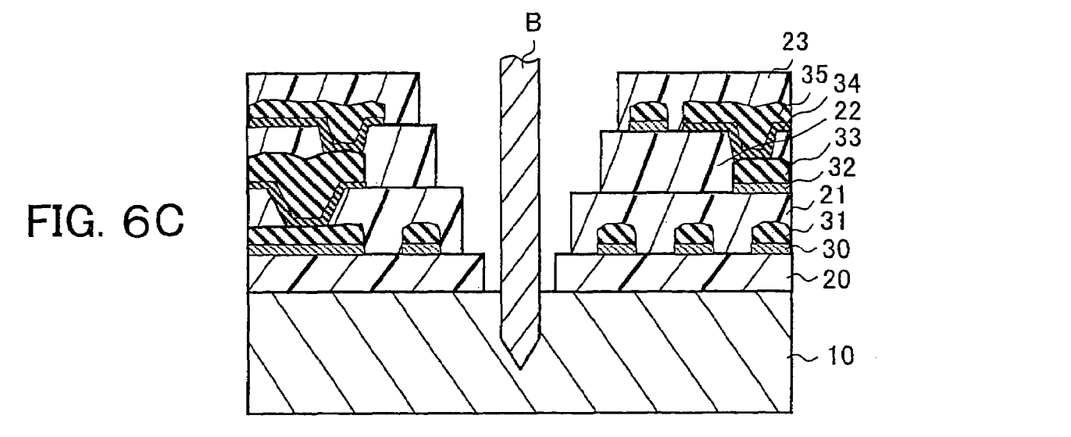

Here, by performing a dicing step for cutting the semiconductor wafer 10 into a semiconductor chip 10a along the scribe line SL by using a dicing blade B (with a blade rotation speed of 3000 rpm and a feeding speed of 10 to 15 mm/second), a semiconductor device made to be a small piece, as shown in FIG. 1, is obtained.

In the above dicing step, only the semiconductor wafer is cut and it is not necessary to cut the resin layers; there is therefore the advantage that it is not necessary to select a special blade, either.

In a laminated beam model obtained by putting one substrate with other substrate, when the temperature changes from $T_0$ to $T_1$, expansion of one substrate (a linear expansion coefficient $\alpha_1$) becomes $\alpha_1 (T_1-T_0)$, and expansion of the other substrate (a linear expansion coefficient $\alpha_2$) becomes $\alpha_2 (T_1-T_0)$.

When assuming that the Young's modulus of one substrate is E1 and that of the other substrate is E2 and $\alpha_1 < \alpha_2$, a compression stress of $\frac{1}{4}E(\alpha_2-\alpha_1)(T_1-T_0)$ acts on the one substrate, and the same amount of an extension stress acts on the other substrate.

Accordingly, the effects of removing resin layers on the scribe line as above are to shorten a unit length and to disperse the stresses.

EXAMPLE

In the case of forming a resin layer as four stacked layers (a film thickness of 50 μm in total) on a semiconductor wafer, on which semiconductor chips of 3 mm square are integrated, warps of the semiconductor wafer (a distance of one end portion floating from a plane when pressing the other end of the wafer on the plane) could be reduced by 200 μm by applying the present embodiment.

As explained above, in the production method of a semiconductor device according to the present embodiment, resin layers on the scribe line are removed when stacking the resin layers at a wafer level, and furthermore, a side surface and an upper surface of each of the resin layers are formed to be a stepwise shape, so that warps of the semiconductor wafer can be prevented even without using a resin layer material having special properties.

Also, since the film thickness of the resin layers stacked on the surface other than the scribe line causes warps, the film thickness of the stacked resin layers can be made thicker compared with that in the configuration in which the scribe line is not removed. Namely, when assuming that the film thickness per one layer is not changed, the number of resin layers to be stacked can be increased.

Also, when using resin layers having the same property values, warps of the wafer are reduced only by making the scribe line wide.

Furthermore, in the dicing step, only the semiconductor wafer is cut and it is not necessary to cut resin layers, so that it is not necessary to select a special blade, either. Additionally, it is difficult for the semiconductor wafer and the resin layers to come apart when dicing, and adjustment of the blade feeding speed becomes unnecessary. Accordingly, high throughput can be attained.

The present invention is not limited to the above explanation.

For example, while not described in the above production method of the embodiment, in the step of forming stacked resin layers and a wiring layer on a boundary surface thereof, an electronic element and/or a semiconductor chip may be formed by being buried so as to be electrically connected to a lower wiring layer.

In the above embodiment, four resin layers are stacked, but the number of the layers is not limited to this; the stacked body may be two-layered, three-layered, five-layered or more.

Also, between the semiconductor chip and the resin layers, a buffer layer having an intermediate linear expansion coefficient of both may be provided in accordance with need. The buffer layer is, for example, composed of an epoxy resin layer, etc. filled with filler.

Other than the above, a variety of modifications may be made within the scope of the present invention.

According to the semiconductor device of the present invention, in a SiP-type semiconductor device wherein an insulating layer is configured by stacking a plurality of resin layers on a semiconductor chip, the layer is configured so that formation areas of the plurality of resin layers become gradually smaller from an area of the upper surface of the semiconductor chip, and a side surface and an upper surface of each of the resin layers and the upper surface of the semiconductor chip form a stepwise shape, so that a stress imposed on the semiconductor wafer is small even in a stage before dicing and warps are suppressed.

According to the production method of the semiconductor device of the present invention, in a production method of a SiP-type semiconductor device wherein an insulating layer is configured by a plurality of resin layers stacked on a semiconductor chip, when forming by stacking the first resin layer and the second resin layer, except for the scribe line that is to be a dicing region, the layers are formed so that their areas become gradually smaller from an area of an upper surface of the semiconductor chip, and a side surface and an upper surface of each of the first resin layer and the second resin layer form a stepwise shape, and consequently, a stress imposed on the semiconductor wafer is small even in a stage before dicing and warps can be suppressed in producing a semiconductor device.

The semiconductor device of the present invention can be applied to a system-in-package-type semiconductor device.

The production method of the semiconductor device of the present invention can also be applied for producing a system-in-package-type semiconductor device.

What is claimed is:

1. A production method of a semiconductor device, including the steps of:

forming integrated electronic circuits corresponding to a plurality of semiconductor chips on a semiconductor wafer, and forming electrodes on a surface of the semiconductor wafer by taking them out from the electronic circuits;

forming a pattern of a first resin layer on the surface of the semiconductor wafer except for a scribe line that is to be a dicing region;

forming on the first resin layer a pattern of a first wiring layer electrically connected to the electrodes;

forming a pattern of a second resin layer to cover the first resin layer and the first wiring layer except for the scribe line; and dicing the semiconductor wafer on the scribe line; wherein in the step of forming the second resin layer, the second resin layer is formed on a smaller area than that of the first resin layer, so that a side surface and an upper surface of each of the first resin layer and the second resin layer form a stepwise shape.

2. The production method of a semiconductor device as set forth in claim 1, wherein after the step of forming a pattern of the second resin layer and before the step of dicing, a step of forming a pattern of an additional wiring layer electrically connected to a lower wiring layer and a step of forming a pattern of an additional resin layer except for the scribe line to be the dicing region are performed repeatedly, and in the step of forming the additional resin layer, the additional resin layer is formed in a smaller area than that of a lower resin layer, so that a side surface and an upper surface of each of the lower resin layer and the additional resin layer form a stepwise shape.

3. The production method of a semiconductor device as set forth in claim 1, wherein in the step of forming the first resin layer and the step of forming the second resin layer, a photosensitive resin layer is formed and a pattern is formed by exposing and developing in the pattern.

4. The production method of a semiconductor device as set forth in claim 1, wherein the step of forming the first wiring layer includes a step of forming an all over seed layer, a step of forming a resist film in a pattern excluding a formation region of the first wiring layer, a step of forming the first wiring layer on the formation region of the first wiring layer on the seed layer, a step of removing the resist film, and a step of removing the seed layer on a region excluding the formation region of the first wiring layer.

5. The production method of a semiconductor device as set forth in claim 1, wherein in the step of forming the second resin layer, the second resin layer is formed, so that a width of the exposed upper surface of the first resin layer that is out of the second resin layer is 5 µm or more.

* * * * *